(12) United States Patent
Liu et al.

(10) Patent No.: US 9,865,607 B1
(45) Date of Patent: Jan. 9, 2018

(54) METHOD OF MAKING A FULLY DEPLETED SEMICONDUCTOR-ON-INSULATOR PROGRAMMABLE CELL AND STRUCTURE THEREOF

(71) Applicant: Avago Technologies General IP (Singapore) Pte. Ltd., Singapore (SG)

(72) Inventors: Qing Liu, Irvine, CA (US); Akira Ito, Irvine, CA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 0 days.

(21) Appl. No.: 15/208,418

(22) Filed: Jul. 12, 2016

Related U.S. Application Data

(60) Provisional application No. 62/355,219, filed on Jun. 27, 2016.

(51) Int. Cl.
| | | |
|---|---|---|
| *H01L 27/12* | (2006.01) | |
| *H01L 27/112* | (2006.01) | |
| *H01L 29/06* | (2006.01) | |
| *H01L 29/08* | (2006.01) | |
| *H01L 29/161* | (2006.01) | |
| *H01L 23/528* | (2006.01) | |
| *H01L 29/51* | (2006.01) | |
| *H01L 21/84* | (2006.01) | |
| *H01L 23/525* | (2006.01) | |

(52) U.S. Cl.
CPC ........ *H01L 27/11206* (2013.01); *H01L 21/84* (2013.01); *H01L 23/528* (2013.01); *H01L 23/5252* (2013.01); *H01L 27/1203* (2013.01); *H01L 29/0649* (2013.01); *H01L 29/0847* (2013.01); *H01L 29/161* (2013.01); *H01L 29/517* (2013.01)

(58) Field of Classification Search
CPC .......... H01L 27/11206; H01L 29/0649; H01L 29/0847; H01L 29/161
USPC ........................................................ 257/348
See application file for complete search history.

(56) References Cited

U.S. PATENT DOCUMENTS

| | | | |
|---|---|---|---|
| 8,835,936 B2* | 9/2014 | Hoentschel | H01L 21/84 257/77 |
| 9,449,884 B1* | 9/2016 | Seo | H01L 21/823814 |
| 9,634,088 B1* | 4/2017 | Thees | H01L 29/0642 |
| 2011/0049627 A1* | 3/2011 | Chang | H01L 29/66636 257/347 |

* cited by examiner

*Primary Examiner* — Anthony Ho
(74) *Attorney, Agent, or Firm* — Foley & Lardner LLP

(57) ABSTRACT

A programmable cell includes a semiconductor-on-insulator substrate, a program gate, and a word line gate. The semiconductor-on-insulator substrate includes a semiconductor layer. The semiconductor layer includes a first doped source/drain region, a second doped source/drain region and a region comprising germanium. The program gate is disposed above the region comprising germanium and includes a first gate dielectric layer disposed below a gate conductor. The word line gate is disposed between the first doped source/drain region and the second doped source/drain region.

20 Claims, 5 Drawing Sheets

US 9,865,607 B1

METHOD OF MAKING A FULLY DEPLETED SEMICONDUCTOR-ON-INSULATOR PROGRAMMABLE CELL AND STRUCTURE THEREOF

CROSS REFERENCE TO RELATED APPLICATIONS

This application claims the benefit of and priority to U.S. Provisional Application No. 62/355,219, entitled "METHOD OF MAKING A FULLY DEPLETED SEMI-CONDUCTOR-ON-INSULATOR PROGRAMMABLE CELL AND STRUCTURE THEREOF," filed on Jun. 27, 2016, which is hereby incorporated by reference herein in its entirety.

FIELD OF THE DISCLOSURE

This disclosure generally relates to a programmable cell or a method of fabricating a programmable cell including but not limited to a one-time programmable (OTP) cell.

BACKGROUND OF THE DISCLOSURE

Embedded nonvolatile memory (NVM) devices include programmable cells which are widely used in electronic products for a variety of operations, including but not limited, to post fabrication testing and programming operations. An OTP cell can be programmed to store a bit using a fuse or an anti-fuse. The OTP cell generally includes a program gate and a transistor having a word line gate between source/drain regions. The program gate is disposed adjacent one of the source/drain regions, and a bit line is coupled to the other of the source drain regions. The word line gate serves as the word line for selecting the OTP cell. When a normal voltage is applied to the word line gate, the equivalent circuit for the transistor is a capacitor and appreciable current (current indicative of a first storage state) does not flow to the bit line. When a program voltage is applied to the program gate, a thin dielectric portion of the program gate breaks down and a resistive path from the channel of the transistor to the program gate is created. The equivalent circuit for the transistor is a resistor after the program voltage is applied and appreciable current flows to the bit line when a normal voltage is applied to the word line gate and the program gate.

OTP cells are generally provided on bulk substrates using conventional complementary metal oxide on semiconductor (CMOS) technology. OTP cells are isolated from each other on the bulk substrate by shallow trench isolation structures which occupy space on the semiconductor substrate, thereby decreasing cell density.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
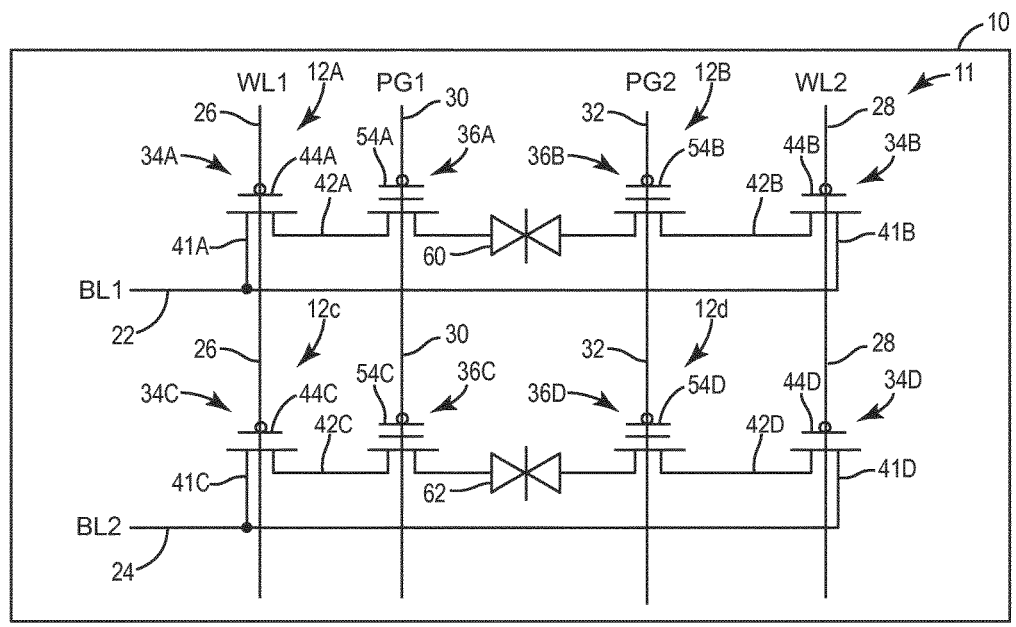
FIG. 1 is an electrical schematic drawing of a circuit including four programmable memory cells.

Before turning to the features, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, programmable cells and fabrication operations for making such cells are shown according to various exemplary embodiments. A programmable cell, such as a one-time programmable (1TP or OTP) cell, is a one transistor or two transistor cell. In some embodiments the programmable cell includes a word line gate and a program gate or includes a split gate structure. In some embodiments, the programmable cell is used in embedded memory applications.

The programmable cell is fabricated on a fully depleted semiconductor-on-insulator substrate (e.g., a fully depleted silicon-on-insulator (FDSOI)) using complementary metal oxide on semiconductor (CMOS) fabrication techniques in some embodiments. The FDSOI substrate provides better electrostatic and matching capabilities than conventional bulk CMOS substrates in some embodiments. The programmable cell on the FDSOI substrate is configured to control the work function to accommodate the thinner channel body and lower electric fields associated with the FDSOI substrate architecture when compared to a bulk substrate architecture in some embodiments. In some embodiments, the programmable cell is fabricated using a 22 nanometer (nm) FDSOI process.

An advantageous FDSOI OTP structure includes a silicon-germanium (SiGe) channel under control of the program gate (PG) and is coupled with a positive-type (P-type) work function gate in some embodiment. The FDSOI OTP structure results in a much lower threshold voltage (Vt) for better programming capability and increased lifetime in some embodiments. The FDSOI device includes two programmable cells, such as, OTP cells, disposed next to each and isolated from each other by a self-aligned isolation junction that provides better overlay control and smaller sizes than shallow trench isolation techniques.

In some embodiments, a programmable cell includes a fully depleted semiconductor—on-insulator substrate, a program gate, and a word line gate. The fully depleted semiconductor—on-insulator substrate includes a semiconductor layer. The semiconductor layer includes a first doped source/drain region, a second doped source/drain region and a region comprising germanium. The program gate is disposed above the region comprising germanium and includes a gate dielectric layer disposed below a gate conductor. The word line gate is disposed between the first doped source/drain region and the second doped source/drain region.

In some embodiments, a method of manufacturing a programmable device includes providing germanium to a first region in a depleted silicon-on-insulator substrate and providing a word line gate and a program gate above the depleted silicon-on-insulator substrate. The program gate is disposed at least partially above the first region. The method also includes providing a first doped source/drain region and a second doped source/drain region. The first doped source/drain region and the second doped source/drain region are disposed in the depleted silicon-on-insulator substrate such that the word line gate is between the first doped source/drain region and the second doped source/drain region.

In some embodiments, a one-time programmable device includes a semiconductor-on-insulator substrate, a first cell disposed on the semiconductor-on-insulator substrate, a second cell disposed on the semiconductor-on-insulator substrate, and a doped isolation region. The first cell includes a first gate disposed between a first doped source/drain region and a second doped source/drain region, and the second cell includes a second gate disposed between a third doped source/drain region and a fourth doped source/drain region. The doped isolation region is disposed between the second doped source/drain region and the fourth doped source/drain region. The doped isolation region is heavily doped with negative-type (N-type) dopants and the second doped source/drain region and the fourth doped source/drain region are heavily doped with P-type dopants.

With reference to FIG. 1, a circuit 10 includes memory cells 12A, 12B, 12C, and 12D. The circuit 10 includes a bit line (BL1) 22, a bit line (BL2) 24, a word line (WL1) 26, a word line (WL2) 28, a program gate line (PG1) 30, a program line (PG2) 32, a back-to-back diode structure 60 and a back-to-back diode structure 62. Although four memory cells 12A-D are shown, the circuit 10 can include any number of memory cells according to various embodiments. The circuit 10 can be part of any type of electronic device, including but not limited to, communication devices, sensing devices, computer devices, and storage devices. The circuit 10 is part of a core area of an integrated circuit (IC) or an input/output area of an IC in some embodiments. In some embodiments, the memory cells 12A-D are disposed in an array of cells disposed on an I/O region that is part of a larger IC.

The memory cells 12A-D can be embodied as a single transistor or two transistor programmable memory cells. In some embodiments, the memory cells 12A-D are two transistor (2T) cells including an anti-fuse device and a pass device. In some embodiments, the memory cells 12A-D are each a single transistor cell including a split gate structure.

Each of the memory cells 12A-D serves to store a logic 1 or 0 according to a one-time programmable scheme in some embodiments. In some embodiments, the memory cells 12A and 12C are selected and programmed via the word line 26 and the program gate line 30, and the stored values in the memory cells 12A and 12C are read through the bit lines 22 and 24, respectively. In some embodiments, the memory cells 12B and 12D are selected and programmed via the word line 28 and the program gate line 32 and the stored values in the memory cells 12B and 12D are read via the bit lines 22 and 24, respectively.

The memory cell 12A includes a word line transistor 34A which includes a source/drain region 41A, a source/drain region 42A, and a gate structure 44A. The word line transistor 34A is pass transistor embodied as a P-channel field effect transistor (FET) in some embodiments. The memory cell 12A also includes a program gate structure 36A including a program gate 54A. The source/drain region 41A is coupled to the bit line 22, and the source/drain region 42A is adjacent to the program gate 54A. The program gate 54A is coupled to the program gate line 30. The program gate 54A is coupled between the back-to-back diode structure 60 and the source/drain region 42A.

The memory cells 12B-D include similar components designated by similar reference numerals with a respective suffix of B-D. For example, the memory cells 12B-D include respective word line transistors 34B-C and program gate structures 36B-C.

The source/drain region 41B of the memory cell 12B is coupled to the bit line 22, and the source/drain regions 41C-D of the memory cells 12C-D are coupled to the bit line 24. The program gate 54C is coupled to program gate line 30 and the program gates 54B and 54D are coupled to the program gate line 32. The gate structures 44B and 44D of word line transistors 34B and 34D are coupled to the word line 28, and the gate structure 44C of the word line transistor 34C is coupled to the word line 26. The back-to-back diode structure 60 provides isolation between the memory cells 12A and 12B and is disposed between the word line transistors 34A and 34B structures, and the back-to-back diode structure 62 provides isolation between the memory cells 12C and 12D and is disposed between the word line transistors 34C and 34D.

A trench isolation structure can be provided between the combination of memory cells 12A and 12B and the combination of memory cells 12C and 12D in some embodiments. Advantageously, the use of the back-to-back diode structures 60 and 62 requires less space than a shallow trench isolation structure, thereby increasing cell density in some embodiments. In some embodiments, the circuit 10 includes a shallow trench isolation structures instead of the back-to-back diode structures 60 and 62.

In some embodiments, the memory cell 12A is programmed by setting the bit line 22 to 0 volts (V) volts, setting the word line 26 at a voltage of the negative drain supply voltage (−Vdd), and setting the program gate line 30 to a negative high voltage (e.g., −3 to −5V) to breakdown the program gate structure 36A and create a conductive path to the source/drain region 42A. The memory cell 12A is read by setting the bit line 22 to 0 V, setting the word line 26 to −Vdd, and the program gate line 30 to a level between −Vdd to −1.8 V. The voltage Vdd can be from 0 to 3 V in some embodiments. The current flow from the bit line 22 to the program gate line 30 can be sensed to determine the stored value. Exemplary signals for operation of memory cell 12A are shown in Table 1 below. The voltage levels and polarities discussed above are exemplary; device criteria, system parameters, threshold voltages, doping concentrations, power supply levels, layer thicknesses, and materials can affect the voltage levels and polarities used for the signals in Table 1.

TABLE 1

| Operation | Select/Unselect | BL | WL | PG |
|---|---|---|---|---|
| Program | select | 0 | −Vdd | −3 to −5 V |
|  | Un-select | floating | 0 | 0 |
| Read | select | 0 | −Vdd | −Vdd |
|  | Un-select | floating | 0 | 0 |

Memory cell 12B as well as memory cells 12C and 12D operate in a similar fashion in some embodiments.

The terms metal oxide semiconductor (MOS) transistor, MOS FET, and FET refer to any transistor, including but not limited to FETs, metal insulator semiconductor (MIS) transistors, half-transistors or capacitor structures. The structures described herein using P-type or N-type dopants are not described in a limiting fashion; the structures can be configured for use with opposite type dopants discussed herein. Further, the concentration of such dopants and types of elements used for doping are not disclosed in a limiting fashion.

Figure 2:
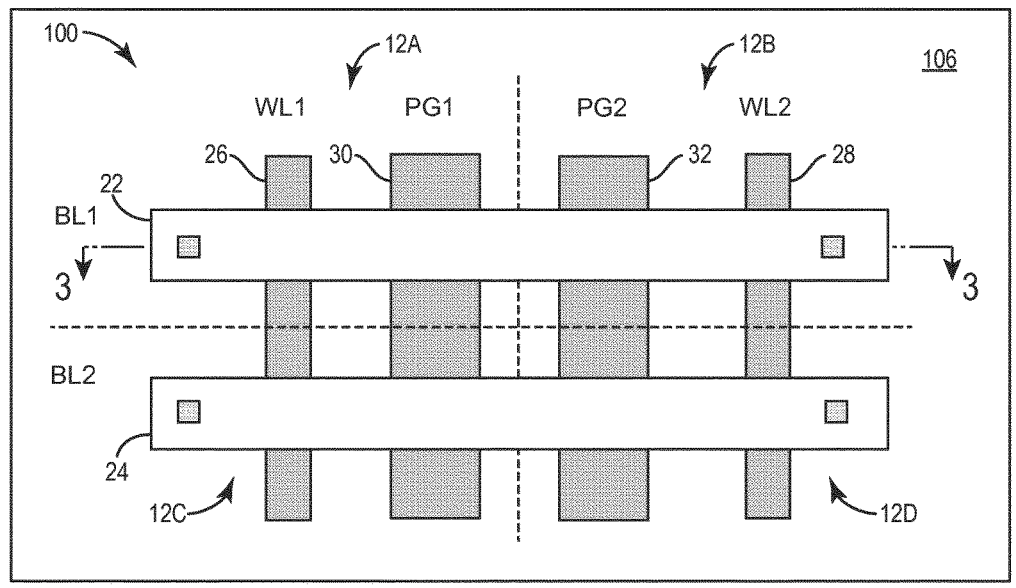
FIG. 2 is a top planar view schematic drawing of the circuit illustrated in FIG. 1 on a substrate according to some exemplary embodiments.

With reference to FIG. 2, the memory cells 12A-D are provided on a substrate, such as, a semiconductor-on-insulator substrate 106 in some embodiments. The semiconductor-on-insulator substrate 106 is a FDSOI substrate, a fully depleted silicon-on-glass substrate, silicon-on-oxide substrate or silicon-germanium-on-insulator substrate in some embodiments. In some embodiments, the semiconductor-on-insulator substrate 106 is a bulk silicon substrate, a bulk germanium substrate, or other substrate for ICs. The semiconductor-on-insulator substrate 106 is doped with P-type, N-type dopants or is fully depleted in some embodiments.

The bit lines 22 and 24 are provided above the word lines 26 and 28 and the program gate lines 30 and 32 which are provided above the semiconductor-on-insulator substrate 106. In some embodiments, the program gate lines 30 and 32 have a width of 20 to 100 nm and the word lines 26 and 28 have a width of 15 to 90 nm in some embodiments. In some embodiments, the program lines 30 and 32 have a width of approximately 30 nm, and the word lines 26 and 28 have a width of approximately 15 nm. In some embodiments, the program gate lines 30 and 32 have a width twice as wide as the width of the word lines 26 and 28. The word lines 26 and 28 and the program gate lines 30 and 32 are dimensioned according to capabilities of a 22 nm FDSOI process in some embodiments.

Figure 3:
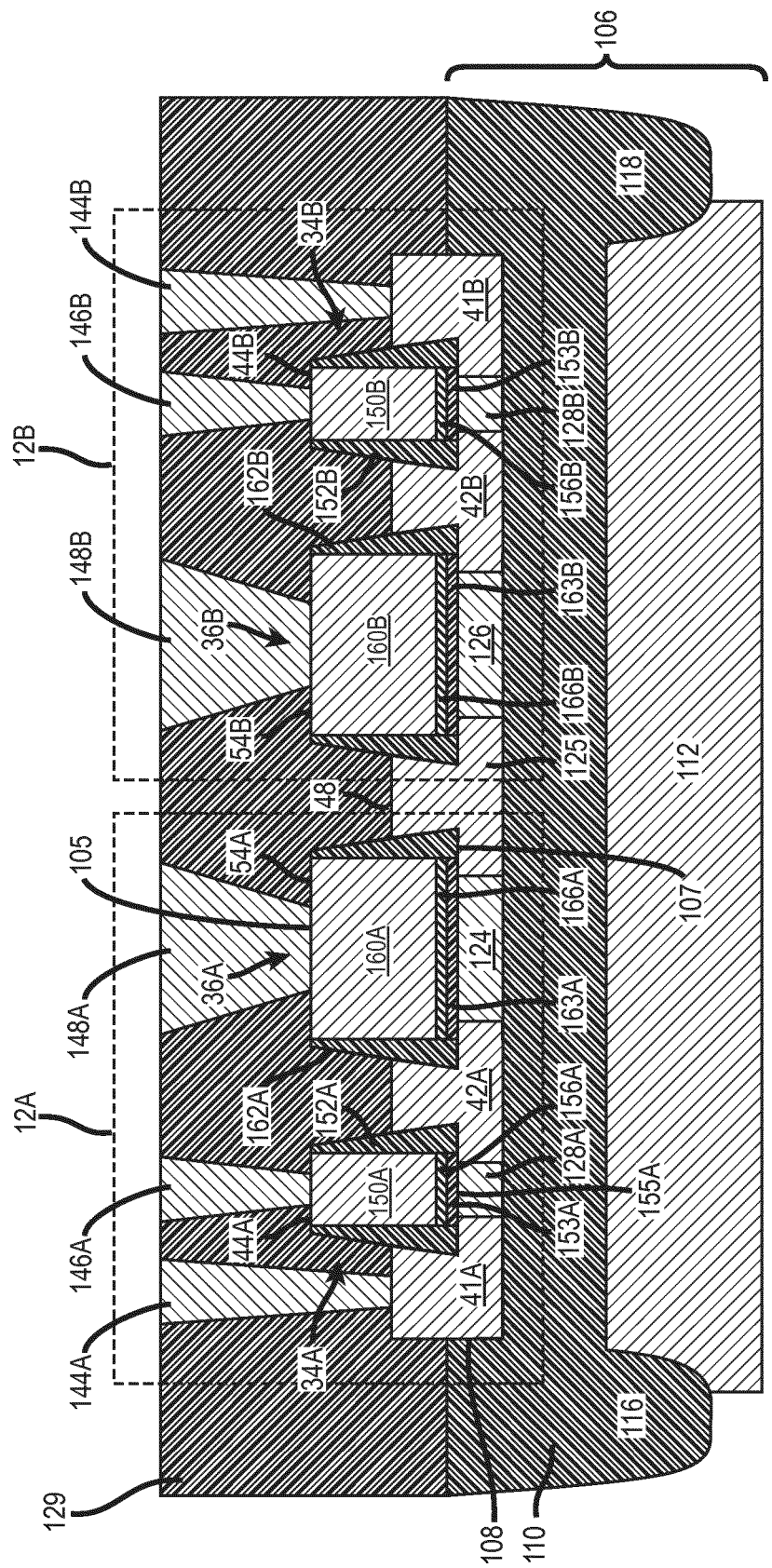
FIG. 3 is a cross sectional view schematic drawing of the circuit on the substrate illustrated in FIG. 2 about line 3-3 according to some exemplary embodiments.

With reference to FIG. 3, a cross section of the circuit 10 includes the memory cells 12A and 12B. The memory cells 12A and 12B are disposed in and above the semiconductor-on-insulator substrate 106. An insulative layer 129 is provided above the semiconductor-on-insulator 106 and covers the word line transistors 34A-B and the program gate structures 36A and 36B in some embodiments.

The semiconductor-on-insulator substrate 106 includes a semiconductor layer 108, an insulative layer 110, and a substrate layer 112. The substrate layer 112 is a bulk substrate material such as a P-type silicon substrate (e.g., lightly doped) or undoped silicon substrate. The semiconductor layer 108 is a fully depleted thin film silicon layer in some embodiments. The semiconductor layer 108 is disposed above the insulative layer 110 in some embodiments. The insulative layer 110 is an oxide layer such as a silicon dioxide layer or other insulator. The semiconductor-on-insulator substrate 106 includes shallow trench isolation structures 116 and 118 for isolating the combination of the memory cells 12A and 12B in some embodiments.

The semiconductor layer 108 includes regions 124 and 126 contain germanium in some embodiments. In some embodiments, the regions 124 and 126 include silicon-germanium. The regions 124 and 126 are 10-40 percent (e.g., 20 to 30 percent (approximately 25 percent)) germanium with the remaining material being silicon in some embodiments. The regions 124 and 126 provide compressive strain for higher hole mobility and lower the P-channel FET threshold voltage Vt associated with the program gate structure 36A by approximately 250 mV to 600 mV (e.g., 430 to 510 mV) in some embodiments. Such a reduction in threshold voltage can increase device lifetime by 5 times in some embodiments. The semiconductor layer 108 has an exemplary thickness of 6-10 nm in some embodiments. The insulative layer 110 has a thickness of 10-25 nm, and the substrate layer 112 has a thickness of more than 50 nm in some embodiments. Other layer thickness are can be used.

The word line transistor 34A includes the gate structure 44A including a gate conductor 150A, a high K gate dielectric layer 156A and a gate dielectric layer 153A. The gate structure 44A is disposed over a channel region 128A. The channel region 128A is fully depleted and disposed between source/drain regions 41A and 42A and under the gate conductor 150A in some embodiments. The gate structure 44A includes spacers 152A on either side of the gate conductor 150A in some embodiments. The word line transistor 34B includes similar structures.

The program gate structure 36A includes the program gate 54A including a gate conductor 160A, a high K gate dielectric layer 166A and a gate dielectric layer 163A. The program gate 54A is disposed over the region 124. The region 124 is disposed between a doped region 125 associated with the back-to-back diode structure 60 and the source/drain region 42A and under the gate conductor 160A in some embodiments. The program gate 54A includes spacers 162A on either side of the gate conductor 160A in some embodiments. The program gate structure 36B includes similar structures.

The doped region 125 is doped with dopants of opposite polarity to the dopants used for the source/drain regions 42A and 42B and provides the back-to-back diode structure 60 for the memory cells 12A and 12B in some embodiments. In some embodiments, the doped region 125 is biased to have a voltage level greater than the voltage on either side of the doped region 125.

The region 124 is disposed between the doped region 125 associated with the back-to-back diode structure 60 and the source/drain region 42A and under the gate conductor 160A in some embodiments. The region 126 is disposed between the doped region 125 associated with the back-to-back diode structure 60 and the source/drain region 42B and under the gate conductor 160B.

A conductive via 144A is coupled to the source/drain region 41A and is coupled to the bit line 22 (FIG. 2), and the gate conductor 150A is coupled to a conductive via 146A which is associated with the word line 26 in some embodiments. A conductive via 148A is coupled to the gate conductor 160A of program gate structure 36A which is associated with the program gate line 30 in some embodiments.

A conductive via 144B is coupled to the source/drain region 41B and is coupled to the bit line 22 (FIG. 2) and the gate conductor 150B is coupled to a conductive via 146B which is associated with the word line 28. A conductive via 148B is coupled to the gate conductor 160B of program gate structure 36B which is associated with the program gate line 32 in some embodiments.

The gate conductors 150A and 160A are a polysilicon conductors (e.g., heavily doped with P-type dopants), a metal gate conductors, or other conductive material in some embodiments. The gate conductors 150A and 160A can be aluminum, tantalum nitride, tungsten, niobium and various alloys thereof. The gate conductors 150A and 160A are a stack of metal layers in some embodiments and include copper in some embodiments. The gate conductors 150A and 160A are 200-400 nm thick (e.g., less than 300 nm thick) and 15 to 100 nm wide in some embodiments.

The gate dielectric layers 153A-B and 163A-B are disposed between the high K gate dielectric layers 156A-B and 166A-B, respectively, and the semiconductor-on-insulator substrate 106 in some embodiments. The gate dielectric layers 153A-B are approximately 0-5 nanometers thick (e.g., 3 nm thick) of thermally grown silicon dioxide in some embodiments. In some embodiments, the gate dielectric layers 163A-B are approximately 0-5 nanometers thick (e.g., 3 nm thick) of thermally grown silicon dioxide and germanium oxide in some embodiments.

The high K gate dielectric layers 156A-B and 166A-B are disposed above the gate dielectric layers 153A-B and 163A-B, respectively. The high K gate dielectric layers 156A-B and 166A-B are metal oxide high-K dielectric layers (e.g., nitride and hafnium silicates (HfSiON), hafnium dioxide (HfO2), hafnium silicon oxide (HfSiO), cesium oxide, tantalum oxide, etc.). Other materials for high K gate dielectric layers 156A-B and 166A-B include zirconium silicate, zirconium dioxide, etc.

In operation, when a resistive path has not been formed through the gate dielectric layer 163A and the high K gate dielectric layer 166A and a select voltage is applied to gate conductor 150A and the gate conductor 160, the equivalent circuit for the memory cell 12A is a capacitor and appreciable current (e.g., current indicative of a first storage state) does not flow to the bit line 22 via the source/drain regions 41A and 42A, the channel region 128A and the conductive via 144A in some embodiments. When a program voltage is applied to the gate conductor 160A and the select voltage is applied to gate conductor 150A with the bit line 22 at 0 V, the gate dielectric layer 163A and the high K gate dielectric layer 166A break down and a resistive path from the gate conductor 160A to the source/drain region 42A is formed in some embodiments. After the resistive path is formed and when a select voltage is applied to the gate conductor 150A and to the gate conductor 160A, appreciable current (e.g., current indicative of a second storage state) does flow to the bit line 22 via the source/drain regions 41A and 42A, the channel region 128A and the conductive via 44A. Memory cells 12B-D operate in a similar fashion.

Figure 4:
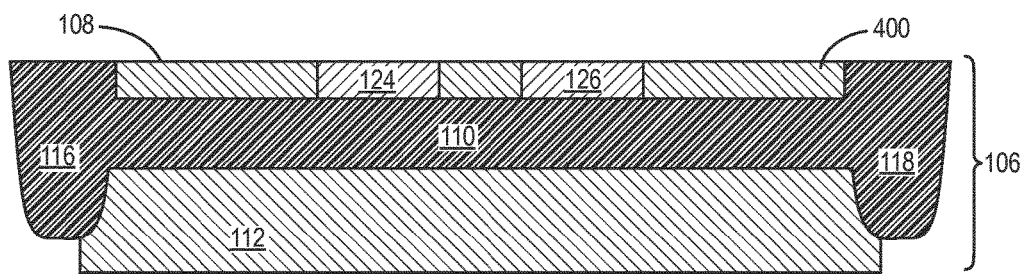
FIG. 4 is a cross sectional view schematic drawing of the substrate illustrated in FIG. 3 showing a germanium region formation operation for fabricating the circuit illustrated in FIG. 1 according to some exemplary embodiments.

With reference to FIG. 4, the semiconductor-on-insulator substrate 106 is provided. The regions 124 and 126 are provided with germanium in a selective epitaxial and condensation operation or in an ion implantation operation. A photoresist mask is used to define regions 124 and 126 in some embodiments.

The shallow trench isolation structure 116 and 118 are formed in a shallow trench isolation operation after the regions 124 and 126 are provided in some embodiments. Trenches for shallow trench isolation structures 116 and 118 can be formed in a reactive ion etch process followed by an insulating layer deposition process and a chemical mechanical polishing process (CMP). The material for the shallow trench isolation structures 116 and 118 can include one or more of silicon oxide, silicon nitride, silicon oxide nitride, fluoride-doped silicate (FSG), and/or a low-K dielectric material.

Figure 5:
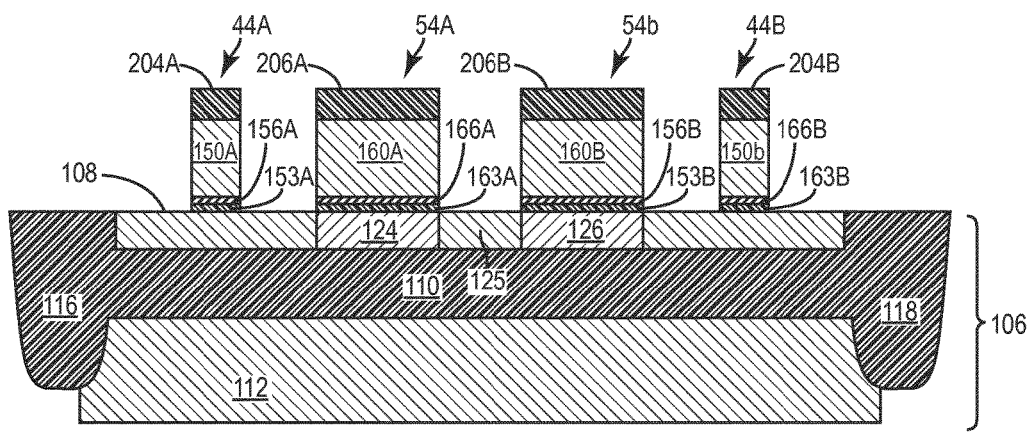
FIG. 5 is a cross sectional view schematic drawing of the substrate illustrated in FIG. 3 showing a gate formation operation for fabricating the circuit illustrated in FIG. 1 according to some exemplary embodiments.

With reference to FIG. 5, gate stacks for the word line transistors 34A-B and the program gate structures 36A-B are formed using deposition and selective etching operations. Material for the gate dielectric layers 153A-B and 163A-B are thermally grown or deposited above the semiconductor layer 108. The regions 124 and 126 provide a silicon germanium interface that is a mixture of germanium oxide (GO) and silicon dioxide (SiO2) which is weaker than pure SiO2 and helps to reduce the program voltage levels in the regions 124 and 126 (e.g., the Si—Ge channels associated with the program gate structures 36A-B). Material for the high K gate dielectric layers 156A-B and 166A-B is provided above the gate material associated with the gate dielectric layers 153A-B and 163A-B, respectively in a deposition process. Material for the high K gate dielectric layers 156A-B and 166A-B is deposited by molecular layer deposition or atomic layer deposition and is 0-4 nm thick (e.g., 2 nm) in some embodiments.

Material for the gate conductors 150A-B and 160A-B is deposited or grown above the material for the high K gate dielectric layers 156A and 166A. Silicon nitride (SiN) material or other hard mask material (e.g., silicon boron carbon nitride (SiBCN), silicon oxycarbonitride (SiOCN), and silicon carbon nitride (SiCN)) for features 204A-B and 206A-B are provided above the material for the gate conductors 150A-B, and 160A-B. The SiN material is provided by enhanced plasm deposition and selectively etched in a photolithographic operation to leave the features 204A-B and 206A-B followed by etching the material (e.g., polysilicon) for the gate conductors 150A-B, and 160A-B, the high K gate dielectric layers 156A-B, and the gate dielectric materials 153A-B in a gate formation operation in some embodiments. Various removal processes can be utilized to form the gate conductors 150A-B and 160A-B, the high K gate dielectric layers 156A-B and 166A-B, and the gate dielectric layers 163A-B and 166A-B.

Figure 6:
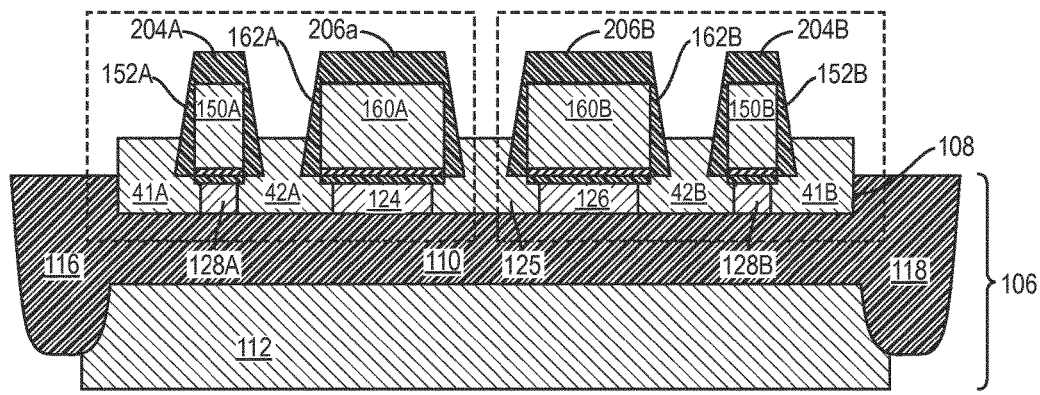
FIG. 6 is a cross sectional view schematic drawing of the substrate illustrated in FIG. 3 showing a spacer formation operation and a source/drain formation operation for fabricating the circuit illustrated in FIG. 1 according to some exemplary embodiments.

With reference to FIG. 6, the spacers 152A-B and 162A-B are formed in a conformal deposition and etch back operation. The spacers 152A-B and 162A-B are nitride spacers or other insulative or dielectric spacers in some embodiments. The spacers 152A-B and 162A-B are between 8 and 16 nm wide and 200-400 nm in height in some embodiments.

The source/drain regions 41A-B and 42A-B and the doped region 125 are formed in a raised source/drain epitaxy operation. In some embodiments, the raised source/drain epitaxy operation is performed after the spacers 152A-B and 162A-B are formed. The source/drain regions 41A-B and 42A-B are in situ doped with Boron (B) to form heavily doped P (P+) regions. The region 125 is in situ doped with Phosphorous (P) to form a heavily doped N (N+) region. The P and N dopants are driven to form proper overlaps. The source/drain regions 41A-B and 42A-B and doped region 125 have a thickness between 12 nm and 30 nm after the raised epitaxy operation.

The doped region 125 advantageously provides self-aligned junction isolation, thereby providing better overlay control than shallow trench isolation structures 116 and 118 and requiring less IC area than shallow trench isolation structures 116 and 118. The spacing is decreased from 120 nm using shallow trench isolation structures to 70 nm using the junction isolation in some embodiments.

With reference to FIG. 3, the features 204A-B and 206A-B are removed in an etching process selective to SiN material in some embodiments. The insulative layer 129 is deposited over the gate conductors 150A-B and 160A-B and source/drain regions 41A-B and 42A-B, the doped region 125 and the shallow trench isolation structures 116 and 118.

The insulative layer 129 is a 200-400 nm thick inter level dielectric layer of silicon dioxide in some embodiments. The insulative layer 129 is deposited by a tetraethyl orthosilicate (TEOS) process or other chemical vapor deposition process in some embodiments.

The conductive vias 144A-B, 146A-B and 148A-B are formed in an etch and fill operation followed by a planarization operation. The conductive vias 144A-B, 146A-B and 148A-B are disposed in the insulative layer 129 connected to a silicide or salicidation layer associated with source/drain regions 41A-B, gate conductors 150A-B and 160A-B, respectively, in some embodiments. The conductive vias 144A-B, 146A-B and 148A-B can be various conductive materials including but not limited to tungsten, aluminum alloys, copper alloys, titanium, etc. Although the conductive vias 144A-B, 146A-B, 148A-B are shown in FIGS. 3-7 in straight line alignment for illustration purposes, the conductive vias 146A-B and 148A-B are offset from the conductive vias 144A-B to avoid contacting the bit line 22 in some embodiments.

Figure 7:
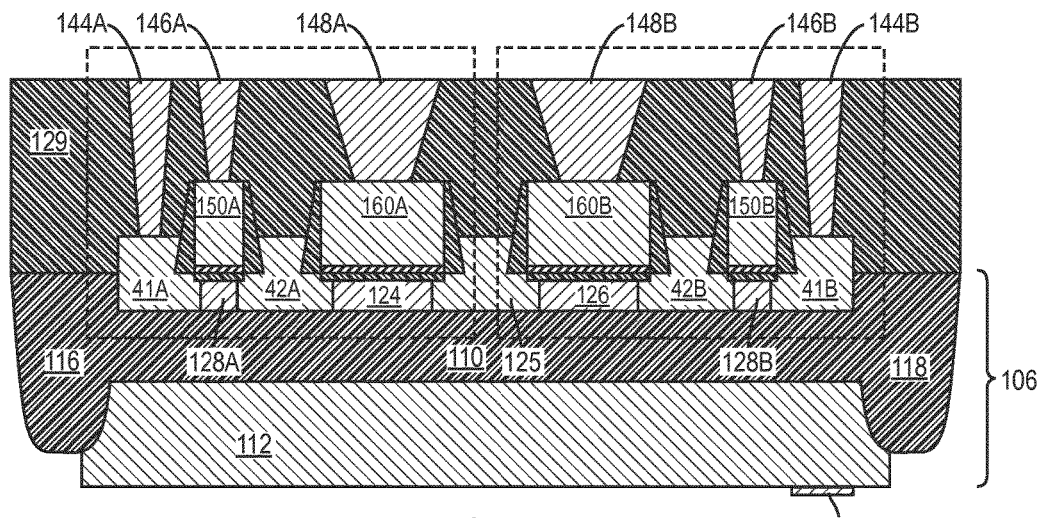
FIG. 7 is a cross sectional view schematic drawing of the circuit on the substrate illustrated in FIG. 2 about line 3-3 including a doped semiconductor-on-insulator substrate according to some exemplary embodiments.

With reference to FIG. 7, the memory cells 12A and 12B are provided over and within the semiconductor-on-insulator substrate 106 which is provided with a layer 720 according to some embodiments. The layer 720 is doped according to a P-well doping operation and a contact 714 can be provided for providing a bias. A negative bias can reduce the threshold voltage. In some embodiments, a back bias at the contact 714 of −1 V reduces the threshold voltage by 80 mV when the insulative layer 110 is a 20 nm thick buried oxide layer.

Figure 8:
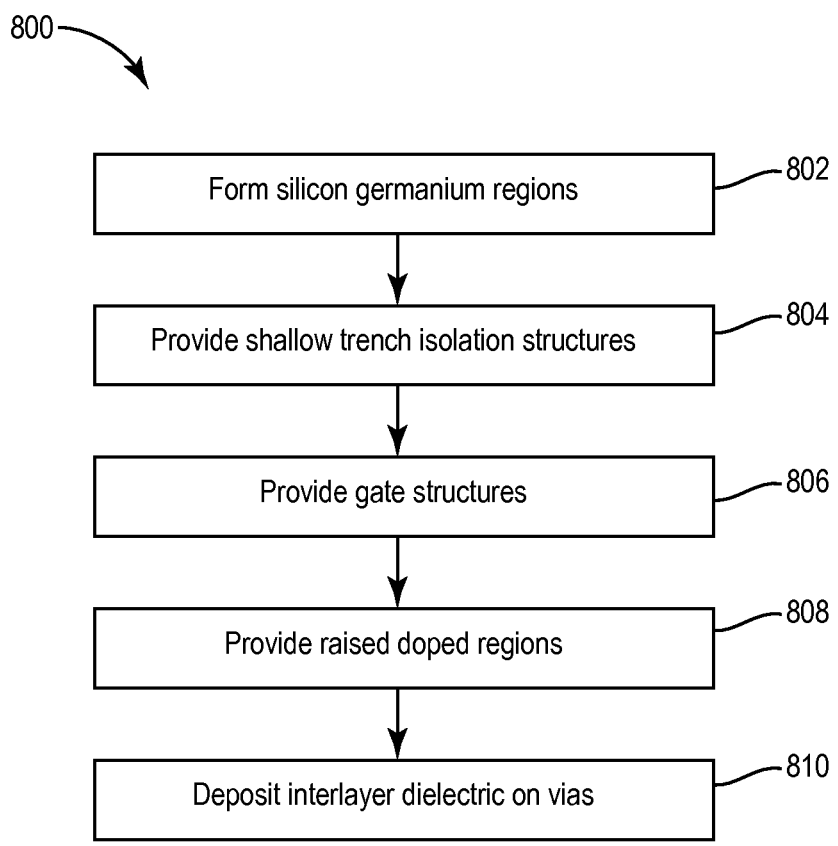
FIG. 8 is a flow diagram showing operations for fabricating the circuit illustrated in FIG. 1 according to some exemplary embodiments.

With reference to FIG. 8, a flow 800 for fabricating the circuit 10 is applied to the semiconductor-on-insulator substrate 106. In some embodiments, the flow 800 does not require additional masking steps from a 22 nm FDSOI flow. At an operation 802, the semiconductor layer 108 of the semiconductor-on-insulator substrate 106 is patterned to form the regions 124 and 126 for germanium containing channels for the program gates 160A-B. At an operation 804, shallow trench isolation structures 116 and 118 are formed.

At an operation 806, gate structures 44A-B and 54A-B are formed by depositing and/or growing materials and selectively etching to leave the gate conductors 150A-B and 160A-B, the high K gate dielectric layers 156A-B and 166A-B, and the gate dielectric layers 153A-B and 163A-B. The spacers 152A-B and 162A-B are formed on the gate conductors 150A-B and 160A-B in the operation 806 in some embodiments. At an operation 808, the source/drain regions 41A-B and 42A-B and the doped region 125 are formed as raised regions. The raised regions can be silicided in the operation 808 in some embodiments. At an operation 810, the insulative layer 129 is deposited and the conductive vias 144A-B, 146A-B and 148A-B are formed in some embodiments. Metal interconnect layers for the bit lines 22 and 24 are formed above the insulative layer 129 in some embodiments.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with devices for purposes of identifying or differentiating one from another or from others. These terms are not intended to relate entities or operations (e.g., a first region and a second region) temporally or according to a sequence, although in some cases, these entities can include such a relationship. Nor do these terms limit the number of possible entities or operations. Further, the term source/drain region refers to a source region, a drain region, or a region that can be used as a source or a drain.

It should be understood that the circuits described above can provide multiple ones of any or each of those components. In addition, the structures, circuits and methods described above can be adjusted for various system parameters and design criteria, such as shape, depth, thicknesses, etc. Although shown in the drawings with certain components directly coupled to each other, direct coupling is not shown in a limiting fashion and is exemplarily shown. Alternative embodiments include circuits with indirect coupling between the components shown.

It should be noted that although the flowcharts provided herein show a specific order of method steps, it is understood that the order of these steps can differ from what is depicted. Also two or more steps can be performed concurrently or with partial concurrence. Such variation will depend on the software and hardware systems chosen and on designer choice. It is understood that all such variations are within the scope of the disclosure.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A programmable cell, comprising:
    a fully depleted semiconductor-on-insulator substrate comprising a semiconductor layer, the semiconductor layer comprising a first doped source/drain region, a second doped source/drain region and a region comprising germanium, wherein the first doped source/drain region is coupled to a bit line and the second doped source/drain region is adjacent the region comprising germanium;
    a program gate disposed above the region comprising germanium and comprising a gate dielectric layer disposed below a gate conductor; and
    a word line gate disposed between the first doped source/drain region and the second source/drain region.

2. The programmable cell of claim 1, wherein the programmable cell is a one-time programmable cell and the first doped source/drain is a source, a drain or a combination of source and drain.

3. The programmable cell of claim 1, wherein the first doped source/drain region and the second source/drain region are heavily doped P type regions.

4. A programmable cell, comprising:
    a fully depleted semiconductor-on-insulator substrate comprising a semiconductor layer, the semiconductor layer comprising a first doped source/drain region, a second doped source/drain region and a region comprising germanium, wherein the region comprising germanium comprises silicon germanium region, wherein the silicon germanium region is 20 to 30 percent germanium;

a program gate disposed above the region comprising germanium and comprising a gate dielectric layer disposed below a gate conductor; and a word line gate disposed between the first doped source/drain region and the second source/drain region.

5. The programmable cell of claim 4, wherein the gate dielectric layer is comprised of a high K gate dielectric layer and a dielectric layer comprising germanium oxide.

6. The programmable cell of claim 4, wherein the first doped source/drain region is coupled to a bit line and the second doped source/drain region is adjacent the region comprising germanium.

7. The programmable cell of claim 4, wherein the silicon germanium region is between the second doped source/drain region and a heavily doped N type region.

8. A method of manufacturing a programmable cell, the method comprising:

providing a fully depleted semiconductor-on-insulator substrate comprising a semiconductor layer, the semiconductor layer comprising a first doped source/drain region, a second doped source/drain region and a region comprising germanium;

providing a bit line, wherein the first doped source/drain region is coupled to the bit line and the second doped source/drain region is adjacent the region comprising germanium;

providing a word line gate between the first doped source/drain region and the second source/drain region; and providing a program gate above the region comprising germanium and comprising a gate dielectric layer disposed below a gate conductor.

9. The method of claim 8, further comprising:

providing a junction isolation region in the depleted silicon-on-insulator substrate at a location next to a first side of the first doped source/drain region opposite a second side of the first doped source/drain region, the second side being next to the second doped source/drain region.

10. The method of claim 9, wherein the first doped source/drain region and the second doped source/drain region are provided as raised in situ heavily doped P type regions and the junction isolation region is provided as a raised in situ heavily doped N type region.

11. The method of claim 9, wherein the junction isolation region is part of a back-to-back diode.

12. The method of claim 8, further comprising:

doping a substrate layer below an oxide layer of the depleted silicon on insulator substrate with P type dopants; and providing a back gate to the substrate layer for providing a bias to lower a threshold voltage.

13. The method of claim 8, wherein the program gate has a lower threshold voltage due to the first region.

14. The method of claim 8, wherein the silicon layer has a thickness of 6 to 10 nanometers.

15. The method of claim 8, further comprising:

forming a high K gate dielectric layer above the depleted silicon-on-insulator substrate, and wherein the depleted silicon-on-insulator substrate is a fully depleted substrate.

16. A one-time programmable device, comprising:

a semiconductor-on-insulator substrate;

a first cell disposed on the semiconductor-on-insulator substrate and comprising a first gate disposed between a first doped source/drain region and a second doped source/drain region;

a second cell disposed on the semiconductor-on-insulator substrate and comprising a second gate disposed between a third doped source/drain region and a fourth doped source/drain region; and a doped isolation region disposed between the second source/drain region and the fourth source/drain region, the doped isolation region being heavily doped with N type dopants and the second doped source/drain region and the fourth doped source/drain region being heavily doped with P type dopants.

17. The one-time programmable device of claim 16, wherein the semiconductor-on-insulator substrate comprises a silicon layer above an oxide layer, wherein the doped isolation region extends form a top surface of the silicon layer to a top surface of the oxide layer.

18. The one-time programmable device of claim 16, wherein the semiconductor-on-insulator substrate comprises a silicon layer above an oxide layer, wherein the silicon layer comprises a silicon germanium region, wherein the first cell comprises a first program gate disposed above the silicon germanium region.

19. The one-time programmable device of claim 18, wherein the second cell comprises a second program gate, wherein the doped isolation region is disposed between the first program gate and the second program gate.

20. The one-time programmable device of claim 16 further comprising a first trench isolation structure and a second trench isolation structure disposed in the semiconductor-on-insulator substrate, wherein the first cell, the second cell, and the doped isolation region are disposed between the first trench isolation structure and the second trench isolation structure.

* * * * *